(12) United States Patent
Kovsh et al.

(10) Patent No.: US 12,218,484 B2
(45) Date of Patent: Feb. 4, 2025

(54) VARIABLE-WIDTH WAVEGUIDE FOR SEMICONDUCTOR OPTICAL AMPLIFIER DEVICES

(71) Applicant: Arista Networks, Inc., Santa Clara, CA (US)

(72) Inventors: Alexey Kovsh, Saratoga, CA (US); David Towne, San Carlos, CA (US); Peter Parkinson, San Jose, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 951 days.

(21) Appl. No.: 17/221,644

(22) Filed: Apr. 2, 2021

(65) Prior Publication Data
US 2022/0320826 A1    Oct. 6, 2022

(51) Int. Cl.
*H01S 5/00*    (2006.01)
*H01S 5/042*    (2006.01)
(Continued)

(52) U.S. Cl.
CPC ............ *H01S 5/1003* (2013.01); *H01S 5/042* (2013.01); *H01S 5/3412* (2013.01); *H01S 5/343* (2013.01); *H04B 10/503* (2013.01)

(58) Field of Classification Search
CPC ...... H01S 5/1003; H01S 5/042; H01S 5/3412; H01S 5/343; H04B 10/503
See application file for complete search history.

(56) References Cited

U.S. PATENT DOCUMENTS

| | | | |
|---|---|---|---|
| 9,036,968 B2 | 5/2015 | Gubenko et al. | |
| 2022/0043202 A1* | 2/2022 | LaChapelle | G01S 17/894 |

(Continued)

FOREIGN PATENT DOCUMENTS

| | | | | |
|---|---|---|---|---|
| CN | 107251241 A | * | 10/2017 | ............ G09G 3/002 |
| GB | 2283858 A | * | 5/1995 | ............... H01S 5/10 |
| JP | 2010003950 A | * | 1/2010 | ............ H01S 5/223 |

OTHER PUBLICATIONS

Fujii, Takuro, et al. "Development of an Epitaxial Growth Technique using III-V on a Si Platform for Heterogeneous Integration of Membrane Photonic Devices on Si." Applied Sciences 11.4 (2021): 1801. (Year: 2021).

(Continued)

*Primary Examiner* — Mark Hellner
(74) *Attorney, Agent, or Firm* — Fountainhead Law Group, PC

(57) ABSTRACT

Embodiments of the present disclosure are directed to a semiconductor optical amplifier including a semiconductor-based gain medium configured to receive a drive current and a variable-width waveguide coupled to the in the semiconductor-based gain medium, the variable-width waveguide including a plurality of narrow width regions and a plurality of wide width regions positioned alternately along a longitudinal axis of the waveguide. The variable-width waveguide further includes a plurality of transition regions having an adiabatically varying widths. Each transition region connects adjacent ones of the plurality of narrow width and width regions and the waveguide has a reduced drive current density in the plurality of wide width regions relative to the drive current density in the plurality of narrow width regions.

19 Claims, 8 Drawing Sheets

(51) Int. Cl.
  *H01S 5/10*   (2021.01)
  *H01S 5/34*   (2006.01)
  *H01S 5/343*  (2006.01)
  *H04B 10/50*  (2013.01)

(56) References Cited

U.S. PATENT DOCUMENTS

2022/0320821 A1    10/2022  Kovsh et al.
2022/0376474 A1*   11/2022  Chin .................... H01S 5/1014

OTHER PUBLICATIONS

Hui, Zhanqiang, et al. "Slot-slot waveguide with negative large and flat dispersion covering C+ L + U waveband for on-chip photonic networks." Applied Optics 58.21 (2019): 5728-5739.

Liang, Di, and John E. Bowers. "Recent progress in heterogeneous 111-V-on-silicon photonic integration." Light: Advanced Manufacturing 2.1 (2021 ): 59-83. (Year: 2021).

Madsen, Christi K., et al. "Integrated all-pass filters for tunable dispersion and dispersion slope compensation." IEEE Photonics Technology Letters 11.12 (1999): 1623-1625. (Year: 1999).

Mas, Sara, et al. "Tailoring the dispersion behavior of silicon nanophotonic slot waveguides." Optics express 18.20 (2010): 20839-20844. (Year: 2010).

* cited by examiner

VARIABLE-WIDTH WAVEGUIDE FOR SEMICONDUCTOR OPTICAL AMPLIFIER DEVICES

BACKGROUND

The present disclosure relates generally to optical communications.

An important application of optical communication is in computer networks connecting servers and storage systems in large data centers. For example, the majority of all network traffic today is generated by servers inside of large Cloud Data Centers that are connected to each other and to the Internet with high-speed Data Center Switches.

The throughput of network switches continues to grow at a significant rate with the next generations of network switch chips providing throughput of 51.2 Tbps (Terabits per second). These switch chips require a large number of lasers for optical communications.

One problem with today's high-speed optical communications is power and reliability. Today's optical communication modules use high power lasers with high current densities that reduce the expected lifetime of the laser and thus the mean time between failure of the modules. Where the optical communications modules utilize edge-emitting diode lasers as the high power lasers, there are several major mechanisms of performance degradation of these diode lasers that can result in failure of the diode lasers and thereby the optical communications module. Moreover, where the optical communications module includes semiconductor optical amplifier (SOA) chips, the major mechanisms of failure of these SOA chips are similar to those causing failure of the edge-emitting diode lasers. These mechanisms of failure include steep or gradual increase in non-radiative free carrier recombination caused by growth of the concentration of precipitation of host atoms, interstitial defects and misfit crystal structure dislocations in the structure of the diode laser. Catastrophic optical mirror damage (COMD) is another failure mechanism. COMD results from the overheating of laser facets during operation, which is caused by thermal runaway due to additional absorption of photons at the facets. Thermal runaway may also result in significant overheating of the semiconductor chip in the diode laser close to voids a bonding alloy between the semiconductor chip and a submount or carrier, which is typically ceramic, of the diode laser.

Failure rates of semiconductor lasers strongly depend on p-n junction temperatures, optical power densities, and drive current densities. The typical formula for failure rate vs temperature, optical power, and drive current for the laser of a given size is as follows:

$$F(T_j, P_m I) = F_{op} \cdot \exp\left(-\frac{E_A}{k_B}\left(\frac{1}{T_j} - \frac{1}{T_{op}}\right)\right) \cdot \left(\frac{P}{P_{op}}\right)^n \cdot \left(\frac{I}{I_{op}}\right)^m$$

where the function F is the failure rate (and MTTF (hrs.)=1/F), $F_{op}$ is a certain value of failure rate at certain p-n junction temperature, $T_{op}$, light power, $P_{op}$ and drive current $I_{op}$, $T_j$ is p-n junction temperature, P is laser optical power, I is laser drive current, $k_B$ is the Boltzmann constant, $E_A$ is the Arrhenius factor (activation energy), n is exponential optical power acceleration, and m is exponential current acceleration. Both optical power and current stimulates the formation, growth and propagation of non-radiative defects resulting in the degradation of laser power, e.g., dark line defects or catastrophic optical mirror damage, or defects. For various types of semiconductor lasers, the sum of exponential acceleration factors "n" and "m" typically exceeds 4. Following the equation above, one can estimate for the set of 512 lasers mentioned earlier, which has an aggregated MTBF of 20,000 hrs. at the drive current and power required by a link budget in an example operating application in an optical network system, such as a data center, the MTBF would be at least 625 ($5^4$) times higher if the lasers are driven at 5 times lower drive currents. In this case the overall MTBF would be equal to 12,500,000 hrs., far exceeding current market acceptance levels. Another problem with today's high-speed optical communications is that the reliability is insufficient for using optical communications within the chassis since an optics failure would require a complete chassis replacement. To enable optical communication within the chassis, including communications using so-called "co-packaged optics" (CPO), the reliability of the optical communications components needs to improve by at least an order of magnitude.

Various embodiments described herein reduce the power and increase the reliability of optical communications components for high-speed data transmission.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions.

DETAILED DESCRIPTION

Described herein are techniques for optical transmitters and optical communication systems. In the following description, for purposes of explanation, numerous examples and specific details are set forth in order to provide a thorough understanding of some embodiments. Some embodiments as defined by the claims may include some or all of the features in these examples alone or in combination with other features described below and may further include modifications and equivalents of the features and concepts described herein.

Figure 1A:
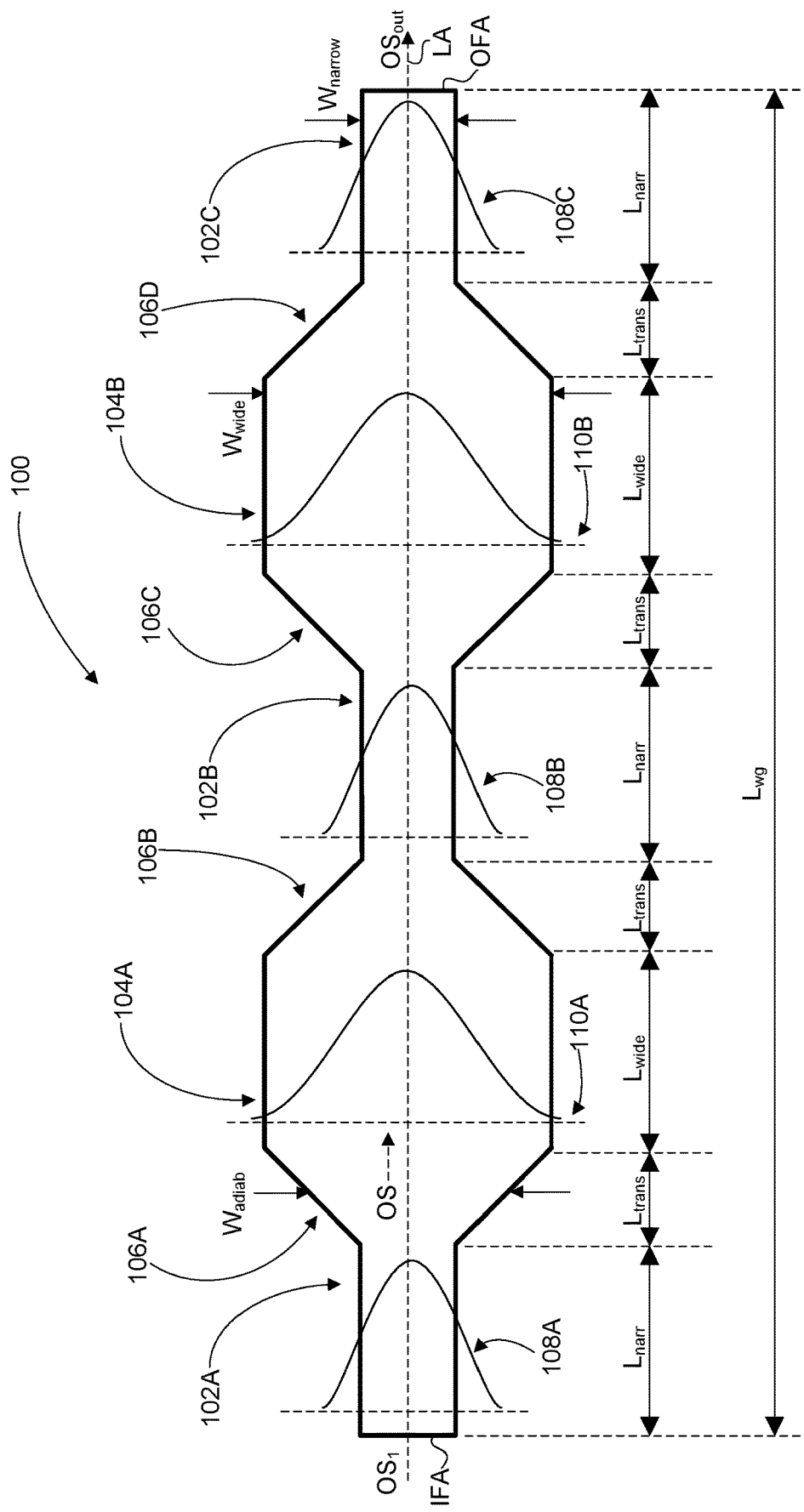
FIG. 1A is a top view of a variable-width waveguide according to one embodiment of the present disclosure.

FIG. 1A is a top view of a variable-width waveguide 100 according to one embodiment of the present disclosure. The variable-width waveguide 100 includes a plurality of narrow width regions 102A-C and a plurality of wide width regions 104A-B positioned alternately with the plurality of narrow width regions along a longitudinal axis LA of the waveguide. Each of the narrow width regions 102A-C has a width $W_{narrow}$ as shown for region 102C and each of the wide width regions 104A-B has a width $W_{wide}$ as shown for region 104B, where the width $W_{wide}$ is greater than the width $W_{narrow}$. A plurality of transition regions 106A-D are formed in the waveguide 100, each transition region connecting adjacent ones of the narrow width regions 102A-C and wide width regions 104A-B. For example, transition region 106A is positioned between narrow width region 102A and wide width region 104A. Each of the transition regions 106A-D has an adiabatically varying width $W_{adiab}$ that varies in a direction along the longitudinal axis LA. In this context, "adiabatically varying" means the width $W_{adiab}$) of the waveguide 100 in the transition regions 106A-D varies in a manner that does not introduce significant scattering or power losses of an optical signal OS (shown in transition region 106A of FIG. 1) propagating along the longitudinal axis LA and allows a desired mode of propagation of this optical signal in the waveguide, as will be discussed in more detail below. In embodiments of the waveguide 100, the waveguide is formed from a suitable material or materials as one or more layers in a semiconductor structure including a plurality of layers, as will be described in more detail below with reference to FIG. 4.

In the present description, a reference numeral along with an associated letter is used to refer to a specific instance of one of a plurality of elements while the reference numeral alone may be used to refer generally to any or all of these elements. For example, the narrow width region 102A refers to the leftmost narrow width region in the waveguide 100 of FIG. 1, while any or all of these narrow width regions may be referred to as "narrow width regions 102" in the present description.

In operation, an input optical signal $OS_1$ is input through an input facet IFA of the waveguide 100 and propagates as optical signal OS along the longitudinal axis LA from left to right in FIG. 1 through the different regions 102, 104, and 106 of the waveguide. The optical signal OS propagates in a direction parallel to the longitudinal axis LA through the regions 102, 104, and 106 of the waveguide 100, which may be described herein as the optical signal propagating along the longitudinal axis LA through the waveguide. The optical signal OS propagates along the longitudinal axis LA and is output from the waveguide 100 through an output facet OFA as an output optical signal $OS_{out}$.

The structure of the waveguide 100 ensures that a single desired mode of the optical signal OS propagates through the waveguide, where this structure of the waveguide includes the shapes and physical sizes of the respective regions 102, 104, and 106 along with the material or materials forming the waveguide. The values of the widths $W_{narrow}$ and $W_{wide}$ of the waveguide 100, for example, are determined, at least in part, by the requirement that only a single mode of the optical signal OS be allowed to propagate through the waveguide, as well as by the wavelength λ of this optical signal.

Before describing the operation and structure of the waveguide 100 in more detail, the operation and structure of a conventional constant width waveguide will first be described. To maintain single mode operation in a waveguide, the width of the waveguide cannot greatly exceed the lasing wavelength λ of the signal generated by a laser or the amplified signal in an SOA. For example, in diode lasers and SOAs operating in the O-band (λ=1.3 μm) the width of a waveguide is limited to about 2-3 μm to ensure single mode operation is maintained.

In addition to limitations placed on the size of a waveguide due to the requirement of single mode operation, current densities also place limitations on the size of an SOA waveguide or cavity in a laser. In a conventional constant width SOA waveguide and a cavity in a laser, the current density is almost uniform. This means that to achieve higher power while maintaining the same current density, a longer cavity length in a laser or SOA waveguide must be utilized. The width of the waveguide may also be increased to help maintain the same current density at a higher power. These changes to the length or width are also preferable from a heat dissipation point of view at each level of power. Due to the presence of internal losses in lasers and SOAs, however, the longer length of the cavity or waveguide leads to a lower power conversion efficiency for the device. There is an optimum cavity length and drive current for a laser or SOA amplifier to achieve the highest wall-plug efficiency (WPE) for a given level of internal losses, with the internal losses being determined by the structure and manufacturing process of the device.

Referring again to FIG. 1A, the desired mode of the optical signal OS is represented in the narrow width regions 102A-C through the field patterns 108A-C and in the wide width regions 104A-B through the field patterns 110A-B as shown in FIG. 1A. As will be understood by those skilled in the art, modes of the optical signal OS correspond to an electromagnetic field pattern of the optical signal in a transverse plane perpendicular to the direction of propagation of the optical signal along the longitudinal axis LA. The field patterns 108A-C and 110A-B represent the fundamental mode (transverse electric field mode $TE_0$) of the optical signal OS that is the desired mode for propagation through the waveguide 100.

In the waveguide 100, the inclusion of the wide width regions 104 reduces a drive current density in these wide width regions relative to the drive current density in the narrow width regions 102. The optical power density in the waveguide 100 is also correspondingly reduced due to the inclusion of the wide width regions 104, while optical gain and output optical power are maintained for the device including the waveguide. In an embodiment of the waveguide 100, the width $W_{wide}$ of each of the wide width regions 104 is twice the width $W_{narrow}$ of each of the narrow width regions 102. In this embodiment, the current density in the wide width regions 104 is half the current density in the narrow width regions 102. As previously described, high current densities in components of an optical system can reduce the expected lifetimes of these components and thereby reduce the meantime between failure of such an optical system. Reducing the current density in the waveguide 100 accordingly improves the reliability of the waveguide and an optical device, such as photonic chip semiconductor optical amplifier (SOA), including the waveguide. This reduced current density in the waveguide 100 reduces optical power density in a certain portion or percentage of the length $L_{wg}$ of the waveguide 100, improving the reliability of the waveguide and optical devices including the waveguide. The specific percentage of the length $L_{wg}$ in which optical power density is reduced will vary in different embodiments of the waveguide 100.

The waveguide 100 of FIG. 1A illustrates one example embodiment of waveguides according to the present disclosure. The number and specific structures of each of the narrow width regions 102, wide width regions 104, and transition regions 106 vary in different embodiments. For example, in the waveguide 100 the adiabatically varying width $W_{adiab}$ of each of the transition regions 106 varies linearly (i.e., has a linear profile) along the longitudinal axis LA. The width $W_{adiab}$ of each transition region 106 varies other than linearly in further embodiments, as will be described in more detail below with reference to FIG. 2. Further embodiments of waveguides according to the present disclosure include more or fewer than three narrow width regions 102A-C, more or fewer than two wide width regions 104A-B, and different numbers of transition regions 106A-D.

FIG. 1A also illustrates corresponding lengths for each of the narrow width regions 102, wide width regions 104, and transition regions 106. More specifically, each narrow width region 102 has a length $L_{narr}$, each wide width region 104 has a length $L_{wide}$, and each transition region 106 has a length $L_{trans}$. In different embodiments of the waveguide 100, the values of the lengths $L_{narr}$, $L_{wide}$, and $L_{trans}$ and values of the widths $W_{narrow}$, $W_{wide}$ vary and are determined, at least in part, by the wavelength λ of the optical signal OS and the material or materials from which the waveguide 100 is formed. The wide width $W_{wide}$ and length $L_{wide}$ of each of the wide width regions 104A-B have values that allow the current density in these regions to be reduced relative to the current density in the narrow width regions 102 while at the same time ensuring that only the desired mode (i.e., fundamental mode $TE_0$) of the optical signal can propagate in the waveguide 100. The narrow width regions 102 have widths $W_{narrow}$ having a size relative to the wavelength λ of the optical signal OS that ensures propagation of only the $TE_0$ mode of the optical signal. The wide width regions 104A-B are then sized to have the wide width $W_{wide}$ and length $L_{wide}$ relative to the wavelength λ of the optical signal OS that ensures only the $TE_0$ mode propagates in these wider width regions as well. Increasing the wide width $W_{wide}$ may help reduce current density but increasing this width and the length $L_{wide}$ too much may allow unwanted modes of the optical signal OS to propagate in the waveguide. Thus, the values for the wide width $W_{wide}$ and length $L_{wide}$ are limited by this constraint. A vertical height of the waveguide, which corresponds to a direction into or out of the page in FIG. 1, may also affect the particular values for the lengths $L_{narr}$, $L_{wide}$, and $L_{trans}$ and widths $W_{narrow}$ and $W_{wide}$.

The profile of each of the transition regions 106, which is defined by the specific characteristics of the variable width $W_{adiab}$ in the transition regions, will also vary in different embodiments. Each of the transition regions 106 has one of an adiabatically increasing width $W_{adiab}$ and an adiabatically decreasing width $W_{adiab}$ relative to a direction of propagation of the optical signal OS along the longitudinal axis LA through the variable-width waveguide 100. In the example embodiment of FIG. 1, the profile of the width $W_{adiab}$ linearly increases in the transition regions 106A, 106C and linearly decreases in regions 106B and 106D since the optical signal OS is propagating from left-to-right in this example. For example, the transition region 106A has the variable width $W_{adiab}$ that is equal to the width $W_{narrow}$ at the left end of this transition region and this variable width increases linearly along the longitudinal axis LA from the left end to a right end where the transition region meets the wide width region 104A. The transition region 106B is one of the transition regions having a profile that linearly decreases along the longitudinal axis LA. The transition region 106B has the variable width $W_{adiab}$ that is equal to the wide width $W_{wide}$ at the left end of this transition region and this variable width decreases linearly along the longitudinal axis LA from the left end to a right end where the transition region meets the narrow width region 102B.

Figure 1B:
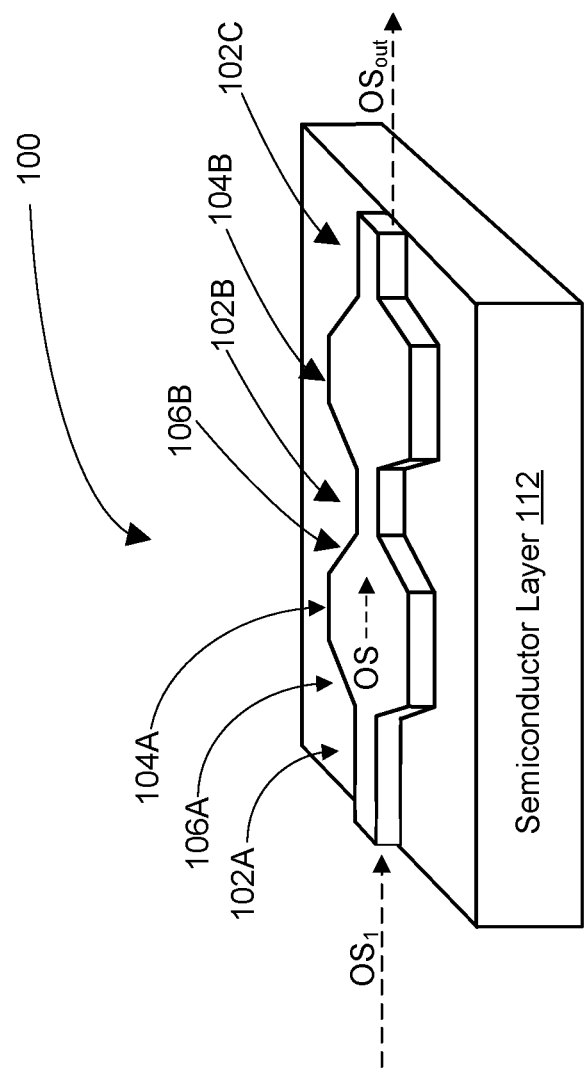
FIG. 1B is a perspective view of the variable-width waveguide of FIG. 1A according to an embodiment.

As previously mentioned, the waveguide 100 is formed from a suitable material or materials as one or more layers in a semiconductor structure including a plurality of layers. A semiconductor structure including the variable-width waveguide 100 is illustrated in FIG. 1B, which is a perspective view of the waveguide formed on a substrate or another semiconductor layer 112. Suitable materials for the waveguide 100 include gallium arsenide (GaAs), aluminum gallium arsenide (AlGaAs), indium gallium arsenide (InGaAs), indium phosphide (InP), silicon (Si), silicon oxide (SiO), as well as combinations of these materials and include other suitable materials as well, as will be understood by those skilled in the art.

In embodiments of the present disclosure, the waveguide 100 may be an integrated part of an SOA chip. The SOA may be a GaAs-based SOA chip with a ridge waveguide or an InP-based SOA chip with a ridge waveguide or a buried heterostructure type waveguide. In these SOA embodiments, example values for structures of the waveguide 100 are now provides. In these embodiments, the length $L_{wg}$ waveguide 100 may be 1 to 4 mm, the narrow width $W_{narrow}$ may be 2-5 the wide width $W_{wide}$ may be 10-25 the ratio $W_{wide}/W_{narrow}$ may be equal to about 5, and the lengths $L_{wide}$ of the wide width regions 104 may be 2-3 times lengths $L_{narrow}$ of the narrow width regions 102. In embodiments, the lengths $L_{trans}$ of the transition regions 106 is 10-30 times the width $W_{wide}$ where the expansion half angle is about 0.05 radian, the lengths $L_{narrow}$ are 200-400 and the lengths $L_{wide}$ are 400-1500 In addition to the sizes the narrow width regions 102, wide width regions 104 and transition regions 106, the numbers of these regions may vary in further embodiments. In embodiments, the SOA including the waveguide 100 is an O-band SOA. The SOA also has different structures in different embodiments and may be an SOA based on InGaAs/InP quantum wells or based on InGaAs/GaAs quantum dots. In embodiments, the drive current density in the wide sections $W_{wide}$ of the variable-width waveguide does not exceed one of 10 kA/cm$^2$ and 5 kA/cm$^2$. In an embodiment, the SOA including the variable-width waveguide operates as a booster that is placed within several meters distance of a silicon photonics (SiP) based transmitter, as described in more detail below with reference to the embodiments of FIGS. 6 and 7.

Figure 2:
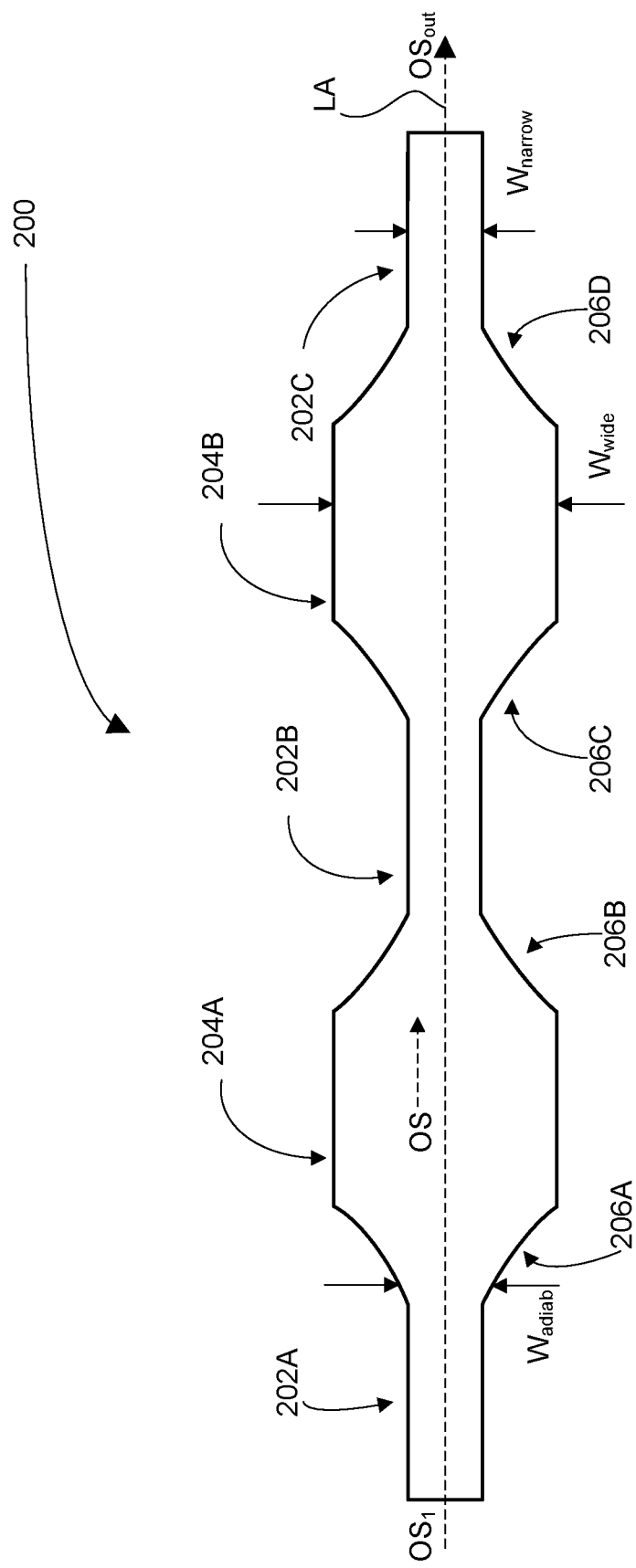
FIG. 2 is a top view of a variable-width waveguide including parabolic transition sections according to another embodiment.

FIG. 2 is a top view of a variable-width waveguide 200 including alternating narrow width regions 202A-C and wide width regions 204A-B where adjacent narrow and wide width regions are connected by parabolic transition regions 206A-D according to another embodiment. In this embodiment, each of the transition regions 206A-D has a parabolic profile of the variable width $W_{adiab}$ instead of a linearly varying profile as in the waveguide 100 of FIG. 1. For example, the transition region 206A has a parabolically increasing width $W_{adiab}$ while transition region 206B has a parabolically decreasing width relative to a direction of propagation of an optical signal OS propagating from left-to-right through the waveguide 200. The specific profile of each of the transition regions 206A-D, which is defined by the specific characteristics of the variable width $W_{adiab}$ in these transition regions, is parabolic in the embodiment of FIG. 2 but may vary and have any other non-linear profiles in further embodiments.

Figure 3:
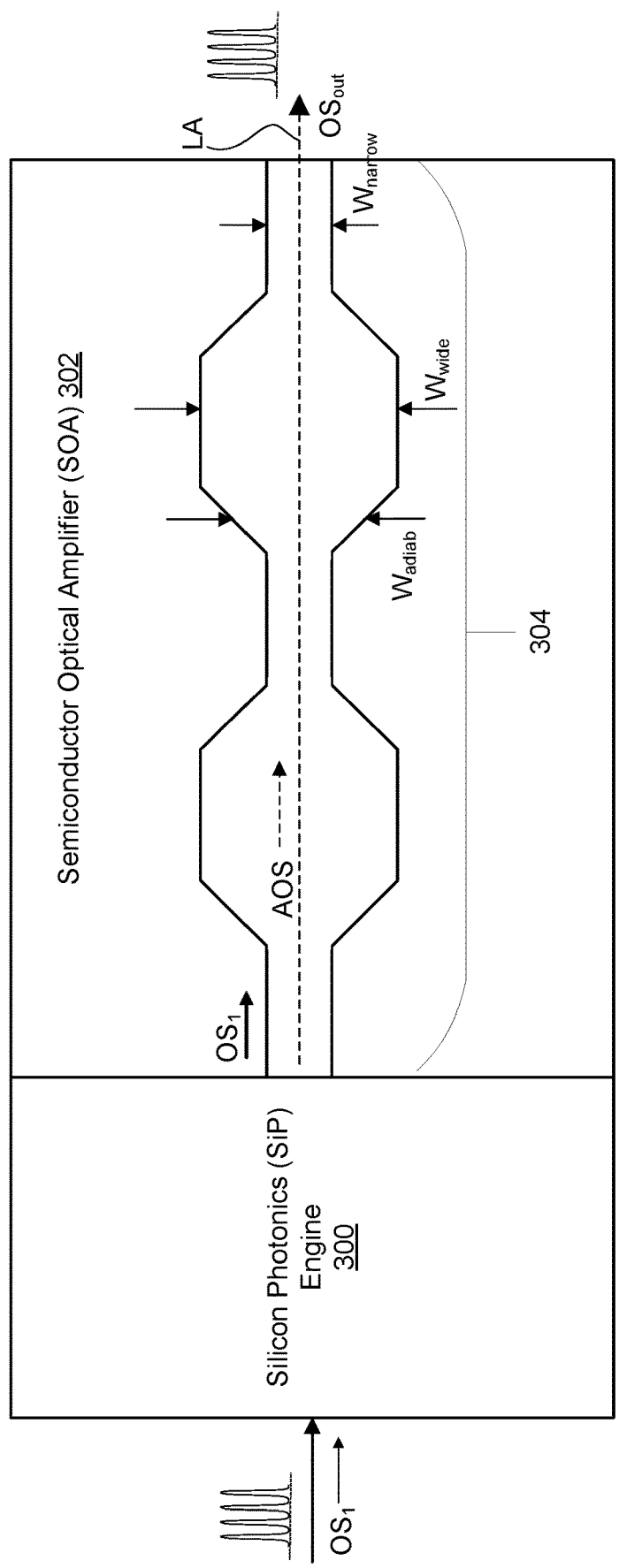
FIG. 3 is a functional diagram of a silicon photonics engine coupled to a variable-width waveguide according to an embodiment.

FIG. 3 is a functional diagram of a silicon photonics (SiP) engine 300 coupled to a semiconductor optical amplifier (SOA) 302 including a variable-width waveguide 304 according to a further embodiment. The SiP engine 300 includes integrated silicon optical components that receive an input optical signal $OS_1$ having multiple wavelengths $\lambda$ and modulates the multiple wavelengths. The SOA 302 receives the modulated optical input signal $OS_1$ from the SiP engine 300 as the signal propagates from left-to-right through the variable-width waveguide 304 and the signal is amplified and provided as an output signal $OS_{out}$ at an output facet of the variable-width waveguide, which would be coupled to external optical components (not shown).

Figure 4:
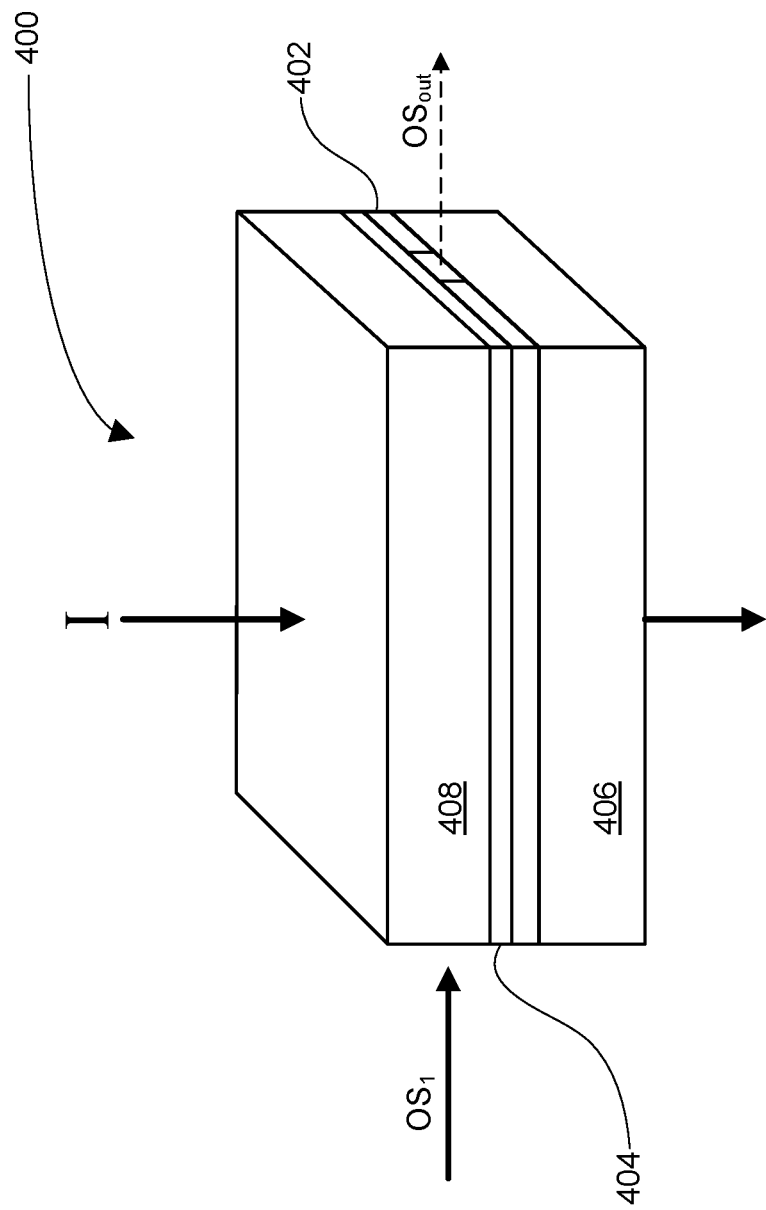
FIG. 4 is a perspective view of a simplified physical structure of a semiconductor optical amplifier including an integrated variable-width waveguide according to an embodiment.

FIG. 4 is a perspective view of a simplified physical structure of a semiconductor optical amplifier (SOA) 400 including an integrated variable-width waveguide 402 according to an embodiment of the present disclosure. An SOA is an optical device based on a semiconductor-based gain material or medium, and includes structure formed by a plurality of layers in a semiconductor layered structure. In the example of FIG. 4, the SOA 400 includes a semiconductor-based gain medium in the form of an active layer 404 that receives a drive current I and functions to amplify a received input optical signal $OS_1$ as this signal propagates through the active region, as will be appreciated by those skilled in the art. The active layer 404 is coupled to the variable-width waveguide 402 so that and an amplified optical signal is coupled into the variable-width waveguide 402 and propagates through the waveguide and out an output facet of the waveguide as an output optical signal $OS_{out}$. The variable-width waveguide 402 is formed in the semiconductor-based gain medium (i.e., in the active layer 404) in embodiments. The SOA 400 further includes, in the example of FIG. 4, a first cladding layer 406 on which the active layer 404 is formed and a second cladding layer 408 formed on the active layer 404. One of the cladding layers 406, 408 would typically be an N-type material and the other would be a P-type material. In this example embodiment the variable-width waveguide 402 is formed in a layer on the first cladding layer 406. The SOA 400 may have other structures in further embodiments.

In operation, the drive current I that is supplied to the active layer 404, which corresponds to the semiconductor-based gain medium of the SOA 400, causes the active layer to amplify the input optical signal $OS_1$ as this signal propagates through the active layer. The SOA 400 has a structure so that the amplified signal $OS_1$ from the active layer 404 is coupled into the variable-width waveguide 402 and propagates through this waveguide and is output as the optical signal $OS_{out}$. The variable-width waveguide 402 is formed in the semiconductor-based gain medium in embodiments of the SOA 400. The inclusion of the wide width regions in the waveguide 402 reduces a drive current density in these wide width regions relative to the drive current density in the narrow width regions of the waveguide. In addition, the optical power density in the waveguide 402 is also correspondingly reduced due to the inclusion of the wide width regions, while optical gain and output optical power may be maintained for the SOA 400.

Figure 5:
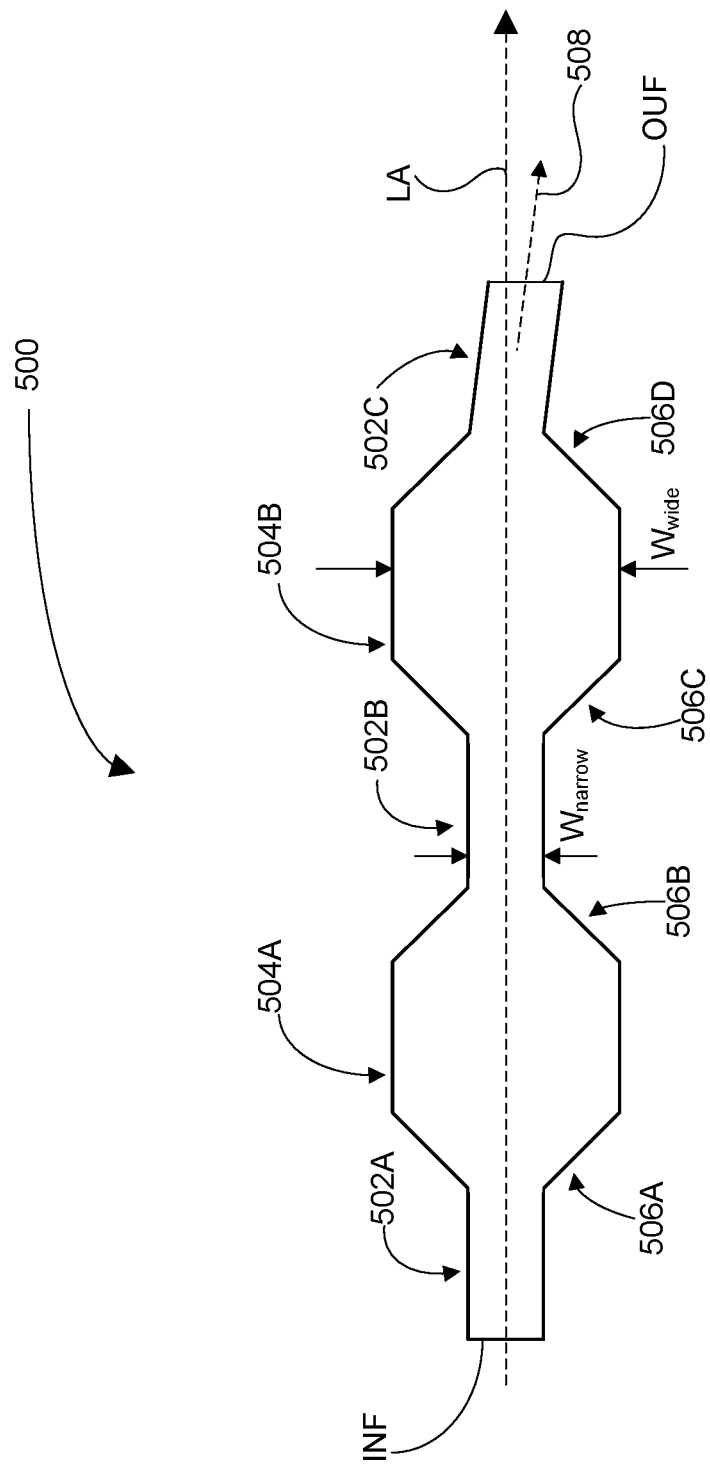
FIG. 5 is a top view of a variable-width waveguide including an angled section at an output facet of the waveguide according to an embodiment.

FIG. 5 is a top view of a variable-width waveguide 500 including a curved or angled section or region at an output facet OUF of the waveguide according to a further embodiment. The waveguide 500 includes narrow width regions 502A-C, wide-width regions 504A-B, and transition regions 506A-D having corresponding widths $W_{narrow}$, $W_{wide}$, and $W_{adiab}$ as previously described for the corresponding regions with reference to the waveguide 100 of FIG. 1. In the waveguide 500, however, the rightmost narrow width region 502C adjoining the output facet OUF of the waveguide is curved or angled relative to longitudinal axis LA of the waveguide. This narrow width region 502C accordingly has a longitudinal axis 508 that is angled relative to the longitudinal axis LA. Instead of being normal to a plane of the output facet OUF as in the embodiments of the waveguides 100-400 of FIGS. 1-4, the narrow width region 502C has a longitudinal axis 508 that is at an acute angle relative to the plane of the output facet OUF. This curving or angling of the narrow width region 502C adjoining the output facet OUF reduces reflections of optical signals that may occur at the output facet, as will be understood by those skilled in the art. Further embodiments of the waveguide 500 include a similar curving or angling of the narrow width region 502A adjoining an input facet INF of the waveguide.

Figure 6:
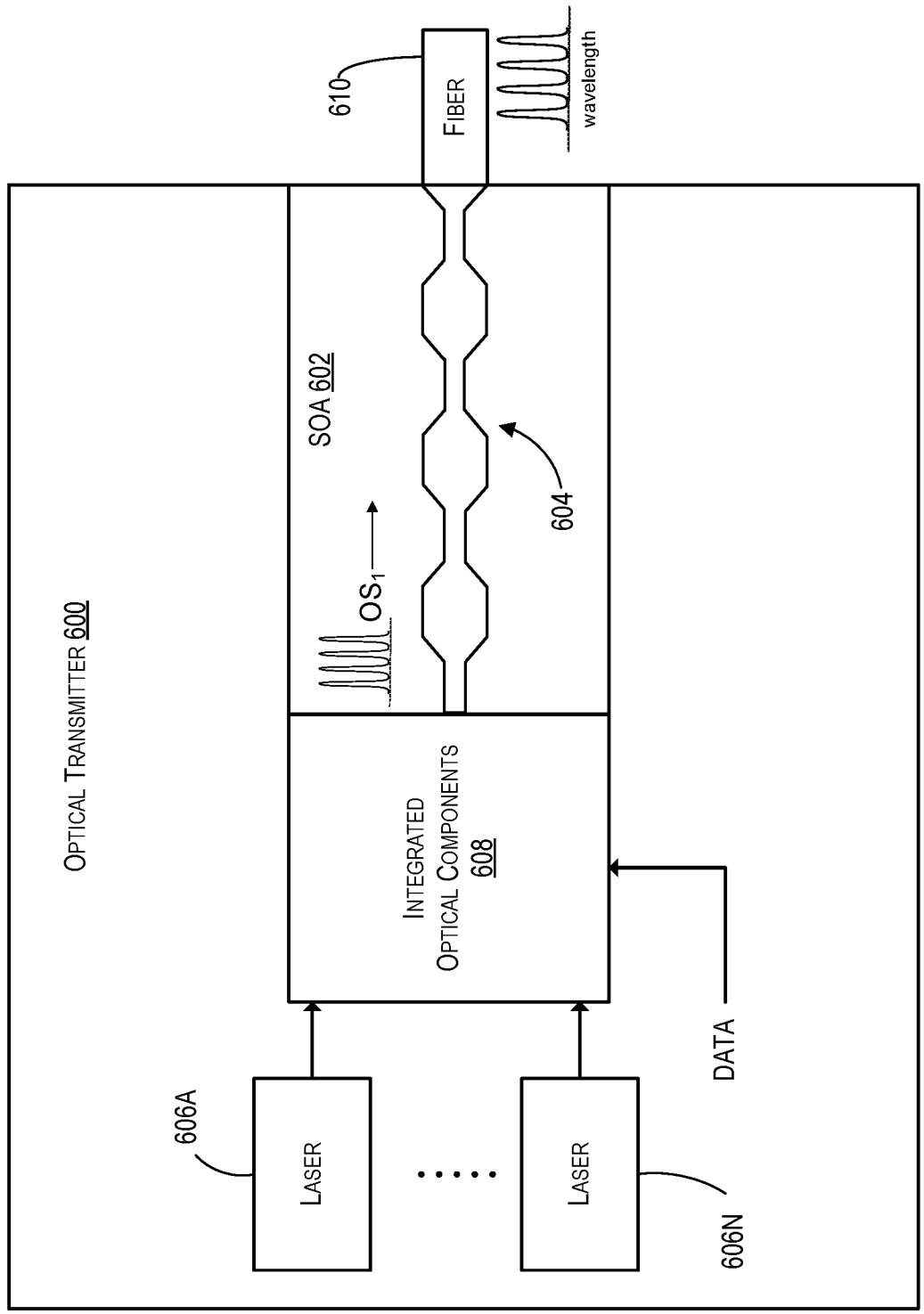
FIG. 6 is a functional block diagram of an optical transmitter including a semiconductor optical amplifier having a variable-width waveguide according to an embodiment.

FIG. 6 is a more detailed functional block diagram of an optical transmitter 600 including an SOA 602 containing a variable-width waveguide 604 according to an embodiment. The SOA 602 may correspond to the SOA 302 or 400 or as described above with reference to FIGS. 3 and 4. The optical transmitter 600 includes a plurality of lasers 606A-N that may each generate different optical signals having different wavelengths $\lambda$. The optical signals having different wavelengths are coupled to integrated silicon optical components 608 (Silicon Photonics), which may include multiplexers for combining the different wavelengths and modulators for modulating the optical signals generated by lasers 606A-N based on electrically encoded data (DATA) to be transmitted. In this example, each laser 606A-N generates an optical signal having a given wavelength $\lambda$, and a modulated optical signal $OS_1$ having a plurality of wavelengths $\lambda$ is accordingly output from the integrated optical components 608 and provided to the SOA 602.

In one embodiment of the optical transmitter 600, the integrated optical components 608 may be coupled to the SOA 602 using polymer-based optical waveguides, which may be formed on printed circuit boards, for example. This coupling of the integrated optical components 608 establishes an optical link from lasers 608A-N to an input of the SOA 602. An output of the SOA 602 is coupled from the variable-width waveguide 604 to a fiber optic cable 610. A suitable connector may be interposed between an output facet of the variable-width waveguide 606 and the fiber optic cable 610 to couple these components to one another.

In one embodiment, the semiconductor-based gain medium in the SOA 602 may include quantum wells so that the SOA is a quantum well SOA. The quantum wells may be InGaAs/InP quantum wells. In another embodiment, the semiconductor-based gain medium of the SOA 602 may include quantum dots so that the SOA is a quantum dot SOA, where these quantum dots may be InGaAs/GaAs quantum dots.

The variable-width waveguide 606 improves the reliability of the optical transmitter 600 by improving the reliability of the components contained in the transmitter, or allowing the use of higher reliability components, which also allows such components to be integrated instead of being separate components. As discussed above, the variable-width waveguide 606 reduces the current density of an optical signal propagating in the waveguide, which improves the reliability of the waveguide since high current densities may result in damage and reduced lifetime of the waveguide. This allows the waveguide 606 to be integrated with the optical amplifier 604 and improves the reliability and increases the mean time between failure (MTBF) of the SOA 602. In addition, the structure of the optical transmitter 600 improves reliability by allowing lower power lasers 608 to be utilized. The required power of the lasers 608A-N is reduced with the architecture of the optical transmitter 600 because each of these lasers may an generate an optical signal at a relatively low power level, with the SOA 602 thereafter amplifying these optical signal to increase their power in accordance with the power requirements of the optical link including the fiber optic cable 612. Reducing the power of the optical signals that must be generated by the lasers 608A-N improves the reliability or lifetime of these lasers (i.e., lower power lasers have a longer MTBF than higher power lasers), which thereby improves the overall reliability of the optical transmitter.

Figure 7:
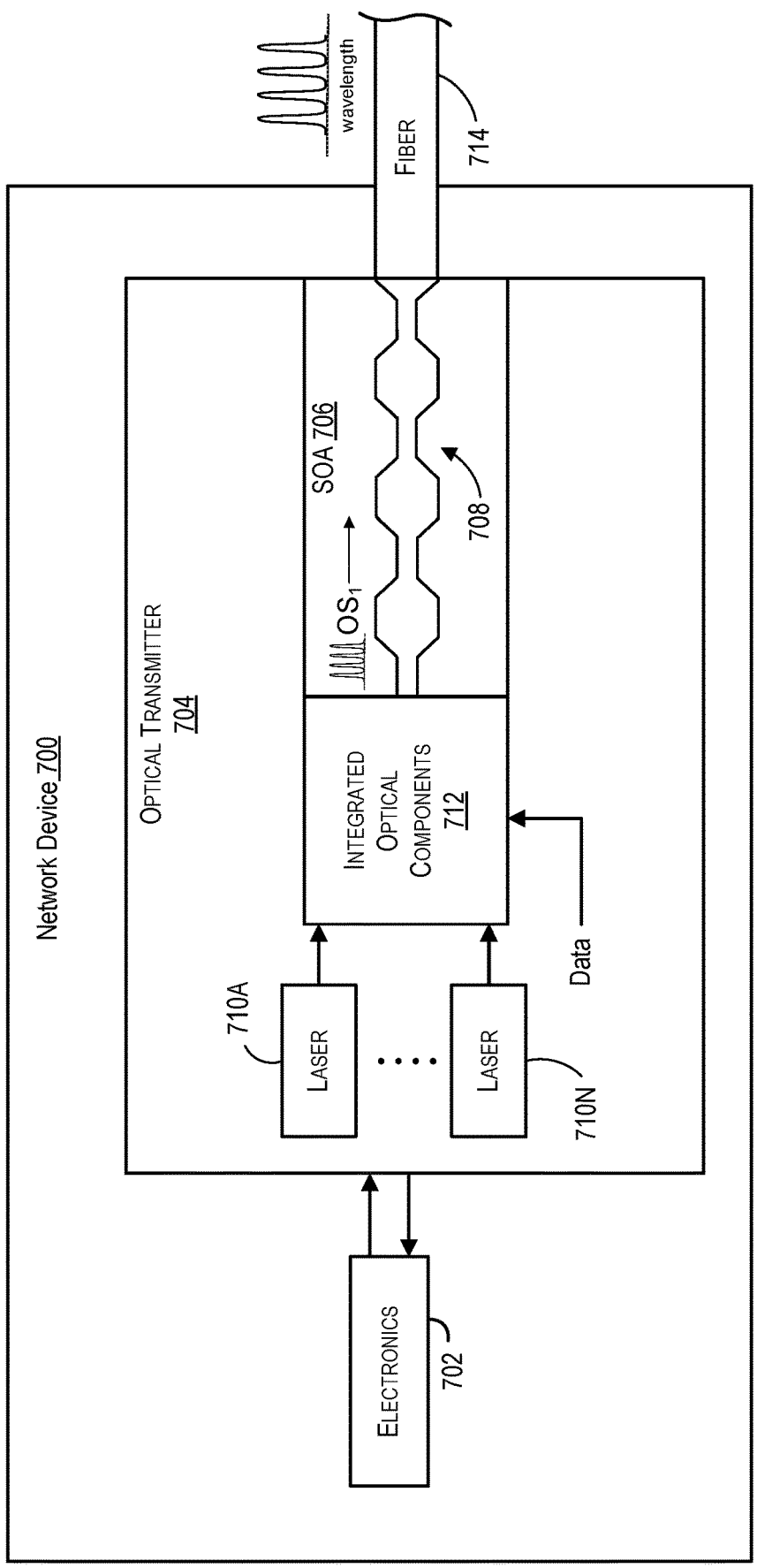
FIG. 7 is a functional block diagram of a network device including an optical transmitter with a semiconductor optical amplifier having a variable-width waveguide according to an embodiment.

FIG. 7 is a functional block diagram of a network device 700 including electronic circuitry or electronics 702 coupled to an optical transmitter 704 containing an SOA 706 including a variable-width waveguide 708 according to an embodiment. In this example embodiment, the optical transmitter 704 includes one or more lasers 710A-N and integrated optical components 712, which may be, for example, a silicon photonics chip. The integrated optical components 712 are coupled to the SOA 706 to establish an optical link from lasers 710A-N to an input of the SOA 706. An amplified output signal $OS_{out}$ from the variable-width waveguide 706 is provided as output of the SOA 706 to a fiber optic cable 714. The electronics 702 may be, for example, network switch or network router circuitry.

FURTHER EXAMPLES

In various embodiments, the present disclosure includes systems, methods, and apparatuses for optical communications.

In one embodiment of the present disclosure, a semiconductor optical amplifier (SOA), comprises: a semiconductor-based gain medium configured to receive a drive current; and a variable-width waveguide in the semiconductor-based gain medium, the variable-width waveguide including a plurality of narrow width regions and a plurality of wide width regions positioned alternately along a longitudinal axis of the waveguide, and including a plurality of transition regions having adiabatically varying widths, each transition region connecting adjacent ones of the plurality of narrow width and width regions and the waveguide having a reduced drive current density in the plurality of wide width regions relative to the drive current density in the plurality of narrow width regions.

In one embodiment of the SOA, each of the transition regions has an adiabatically varying width with a linear profile.

In one embodiment of the SOA, each of the transition regions has one of an adiabatically increasing width and an adiabatically decreasing width relative to a direction of propagation of an optical signal along the longitudinal axis through the variable-width waveguide.

In one embodiment of the SOA, the variable-width waveguide has a longitudinal length between 1 and 4 millimeters.

In one embodiment of the SOA, the narrow width regions, wide width regions, and transition regions are configured to propagate an optical signal having a wavelength in the O-band.

In one embodiment of the SOA, the width of each of the wide width regions is twice the width of each of narrow width regions.

In one embodiment of the SOA, each of the narrow width regions, wide width regions, and transition regions has a length along a longitudinal direction of the variable length waveguide, and wherein a length of each of the wide width regions is 2-3 times the length of each of the narrow width regions and the length of each transition region is 10-30 times the width of each of the wide width regions.

In one embodiment of the SOA, the variable-width waveguide includes an output facet and wherein a final section of the waveguide adjoining the output facet has a longitudinal axis that is one of perpendicular to a plane of the output facet and at an acute angle relative to the plane of the output facet.

In one embodiment of the SOA, the current density in each of the wide width sections does not exceed one of 10 kA/cm2 and 5 kA/cm2.

In one embodiment of the SOA, wherein the amplifying components comprise an active layer.

In another embodiment, an optical transmitter, comprises: a plurality of lasers configured to produce respective optical signals, each optical signal having a wavelength; optical components coupled to the plurality of lasers and configured to output a multiwavelength optical signal; and a semiconductor optical amplifier including a variable-width waveguide coupled to the optical components, the variable-width waveguide including: a plurality of narrow width regions; a plurality of wide width regions positioned alternately with the plurality of narrow width regions along a longitudinal axis of the waveguide, each of the narrow width regions having a width that is smaller than a width of each of the wide width regions; and a plurality of transition regions, each transition region positioned between adjacent ones of the narrow width regions and wide width regions, and each transition region having an adiabatically varying width; and optical components coupled to the variable-width waveguide, the optical components configured to receive a drive current and the waveguide having a reduced drive current density in the plurality of wide width regions.

In one embodiment of the optical device, the semiconductor optical amplifier comprises a quantum well semiconductor optical amplifier.

In one embodiment of the optical device, the quantum wells comprise InGaAs/InP quantum wells.

In one embodiment of the optical device, the semiconductor optical amplifier comprises a quantum dot semiconductor amplifier.

In one embodiment of the optical device, the quantum dots comprise InGaAs/GaAs quantum dots.

In another embodiment, a network device, comprises: electronic circuitry; and an optical transmitter coupled to the electronic circuitry, the optical transmitter including: one or more lasers configured to produce respective optical signals; optical components coupled to the one or more lasers; and a semiconductor optical amplifier coupled to the optical components, the semiconductor optical amplifier including: amplifying components configured to receive a drive current; and a variable-width waveguide including a plurality of narrow width regions and a plurality of wide width regions positioned alternately along a longitudinal axis of the waveguide, and a plurality of transition regions with each transition region positioned between adjacent ones of the narrow width regions and wide width regions and having an adiabatically varying width along the longitudinal axis, wherein the waveguide has reduced a drive current density due to the drive current in the plurality of wide width regions.

In an embodiment of the network device, an optical fiber is coupled to the silicon optical amplifier, and wherein the one or more lasers generate respective optical signals a respective power levels and wherein the semiconductor optical amplifier increases the respective power levels of the optical signals as the optical signals propagate from the lasers through the optical components to the optical fiber.

In an embodiment of the network device, the network device comprises a network switch.

In an embodiment of the network device, each of the transition regions having one of an adiabatically increasing width and an adiabatically decreasing width relative to a direction of propagation of an optical signal along the longitudinal axis through the variable-width waveguide.

What is claimed is:

1. A semiconductor optical amplifier, comprising:
   a semiconductor-based gain medium configured to receive a drive current; and
   a variable-width waveguide in the semiconductor-based gain medium, the variable-width waveguide including a plurality of narrow width regions and a plurality of wide width regions positioned alternately along a longitudinal axis of the waveguide, and including a plurality of transition regions having adiabatically varying widths, each transition region connecting adjacent ones of the plurality of narrow width and wide width regions and the waveguide having a reduced drive current density in the plurality of wide width regions relative to the drive current density in the plurality of narrow width regions,
   wherein each of the transition regions has one of an adiabatically increasing width and an adiabatically decreasing width relative to a direction of propagation of an optical signal along the longitudinal axis through the variable-width waveguide.

2. The semiconductor optical amplifier of claim 1, wherein each of the transition regions has an adiabatically varying width with a parabolic profile.

3. The semiconductor optical amplifier of claim 1, wherein each of the transition regions has an adiabatically varying width with a linear profile.

4. The semiconductor optical amplifier of claim 1, wherein the variable-width waveguide has a longitudinal length between 1 and 4 millimeters.

5. The semiconductor optical amplifier of claim 1, wherein the narrow width regions, wide width regions, and transition regions are configured to propagate an optical signal having a wavelength in the O-band.

6. The semiconductor optical amplifier of claim 1, wherein the width of each of the wide width regions is twice the width of each of narrow width regions.

7. The semiconductor optical amplifier of claim 1, wherein each of the narrow width regions, wide width regions, and transition regions has a length along a longitudinal direction of the variable length waveguide, and wherein a length of each of the wide width regions is 2-3 times the length of each of the narrow width regions and the length of each transition region is 10-30 times the width of each of the wide width regions.

8. The semiconductor optical amplifier of claim 1, wherein the variable-width waveguide includes an output facet and wherein a final section of the waveguide adjoining the output facet has a longitudinal axis that is one of perpendicular to a plane of the output facet and at an acute angle relative to the plane of the output facet.

9. The semiconductor optical amplifier of claim 1, wherein the current density in each of the wide width sections does not exceed one of 10 kA/cm$^2$ and 5 kA/cm$^2$.

10. The semiconductor optical amplifier of claim 1, wherein the amplifying components comprise an active layer.

11. An optical transmitter, comprising:
    a plurality of lasers configured to produce respective optical signals, each optical signal having a wavelength;
    optical components coupled to the plurality of lasers and configured to output a multiwavelength optical signal; and
    a semiconductor optical amplifier including a variable-width waveguide coupled to the optical components, the variable-width waveguide including:
      a plurality of narrow width regions;
      a plurality of wide width regions positioned alternately with the plurality of narrow width regions along a longitudinal axis of the waveguide, each of the narrow width regions having a width that is smaller than a width of each of the wide width regions; and
      a plurality of transition regions, each transition region positioned between adjacent ones of the narrow width regions and wide width regions, and each transition region having an adiabatically varying width; and
    optical components coupled to the variable-width waveguide, the optical components configured to receive a drive current and the waveguide having a reduced drive current density in the plurality of wide width regions.

12. The optical device of claim 11, wherein the semiconductor optical amplifier comprises a quantum well semiconductor optical amplifier.

13. The optical device of claim 12, wherein the quantum wells comprise InGaAs/InP quantum wells.

14. The optical device of claim 11, wherein the semiconductor optical amplifier comprises a quantum dot semiconductor amplifier.

15. The optical device of claim 14, wherein the quantum dots comprise InGaAs/GaAs quantum dots.

16. A network device, comprising:
    electronic circuitry; and
    an optical transmitter coupled to the electronic circuitry, the optical transmitter including:
      one or more lasers configured to produce respective optical signals;
      optical components coupled to the one or more lasers; and
      a semiconductor optical amplifier coupled to the optical components, the semiconductor optical amplifier including:
        amplifying components configured to receive a drive current; and
        a variable-width waveguide including a plurality of narrow width regions and a plurality of wide width regions positioned alternately along a longitudinal axis of the waveguide, and a plurality of transition regions with each transition region positioned between adjacent ones of the narrow width regions and wide width regions and having an adiabatically varying width along the longitudinal axis, wherein the waveguide has reduced a drive current density due to the drive current in the plurality of wide width regions.

17. The network device of claim 16 further comprising an optical fiber coupled to the silicon optical amplifier, and wherein the one or more lasers generate respective optical signals a respective power levels and wherein the semiconductor optical amplifier increases the respective power levels of the optical signals as the optical signals propagate from the lasers through the optical components to the optical fiber.

18. The network device of claim 16, wherein the electronic circuitry comprises one of network switch and network router circuitry.

19. The semiconductor optical amplifier of claim 16, wherein each of the transition regions has one of an adiabatically increasing width and an adiabatically decreasing width relative to a direction of propagation of an optical signal along the longitudinal axis through the variable-width waveguide.

* * * * *